United States Patent [19]
Davies et al.

[11] Patent Number: 5,920,095
[45] Date of Patent: Jul. 6, 1999

[54] SHORT CHANNEL FIELD EFFECT SEMICONDUCTOR DEVICE AND METHOD OF MAKING

[75] Inventors: Robert Bruce Davies, Tempe; Peter J. Zdebel, Mesa, both of Ariz.

[73] Assignee: Motorola, Inc., Schaumburg, Ill.

[21] Appl. No.: 08/903,080

[22] Filed: Jul. 30, 1997

[51] Int. Cl.$^6$ .................................................. H01L 27/01
[52] U.S. Cl. ........................ 257/353; 257/354; 438/180; 365/182
[58] Field of Search .................... 257/522, 623, 257/353, 354

[56] References Cited

U.S. PATENT DOCUMENTS

| | | | |
|---|---|---|---|
| 4,198,252 | 4/1980 | Hsu | 148/187 |
| 4,371,955 | 2/1983 | Sasaki | 365/185 |
| 4,545,109 | 10/1985 | Reichart | 29/571 |
| 4,697,198 | 9/1987 | Komari et al. | 357/23.3 |
| 5,021,845 | 6/1991 | Hashimoto | 357/23.4 |
| 5,395,773 | 3/1995 | Ravindhran et al. | 437/27 |
| 5,434,093 | 7/1995 | Chau et al. | 437/41 |

OTHER PUBLICATIONS

H.Lin et al., "Computer Analysis of the Double–Diffused MOS Transitor for Integrated Circuits," Transactions on Electron Devices, vol. ED–20, No. 3, Mar. 1973, pp. 275–282.
S. Shimizu et al., "0.15 μm CMOS Process for High Performance and High Reliability," IEEE 1994, San Francisco, CA, pp. 67–70.
K. Lee et al., "Room Temperature 0.1μm CMOS Technology with 11.8 ps Gate Delay," IEEE 1993, Washington, DC, pp. 131–134.

*Primary Examiner*—Olik Chaudhuri
*Assistant Examiner*—Douglas A. Wille
*Attorney, Agent, or Firm*—Kenneth M. Seddon; Daniel R. Collopy

[57] ABSTRACT

A semiconductor device (10) is formed in a pedestal structure (16) overlying a semiconductor substrate (11). The semiconductor device (10) includes a source region (44) and a drain region (45) that contact the corners (13) of the pedestal structure (16). Electrical connection to the source region (44) and the drain region (45) is provided by a conductive layer (28) that contacts the sides (12) and corners (13) of the pedestal structure (16).

21 Claims, 7 Drawing Sheets

SHORT CHANNEL FIELD EFFECT SEMICONDUCTOR DEVICE AND METHOD OF MAKING

This invention is related, in general, to a application filed by Davies et al. on Feb. 29, 1996, now U.S. Pat. No. 5,818,098. That application is assigned to the same assignee as the present invention.

BACKGROUND OF THE INVENTION

This invention relates, in general, to insulated gate field effect transistors, and more particularly to short channel insulated gate field effect transistors.

Semiconductor devices such as insulated gate field effect transistor (IGFET) devices are becoming increasingly important in low voltage applications. As IGFET devices are scaled to smaller and smaller dimensions, manufacturers must refine transistor designs to maintain optimum device performance. Typically, in IGFET devices having channel lengths in the sub-micron range, manufacturers must carefully fabricate drain regions to avoid performance degradation problems such as hot carrier injection, drain leakage, punch-through, and the like.

In IGFET devices having channel lengths of about one micron, many device performance problems can be corrected by forming a lightly-doped-drain (LDD) region. The LDD region acts to lower the electric field in the channel region near the drain region. This reduced electric field improves threshold voltage stability by reducing hot carrier injection into the gate oxide layer overlying the channel region. However, the LDD region causes a reduction in performance because of an increase in source resistance, which negatively impacts transconductance. Also, as the channel length approaches 0.5 microns and below, drain engineering techniques (e.g., LDD regions) are not as effective in preventing performance degradation.

Additionally, manufacturers have used counter-doped source and drain regions to reduce sub-surface punch-through in short channel devices. These counter-doped regions are often referred to as "halo" regions. Although the halo regions are effective in reducing punch-through, they decrease carrier mobility in the channel region, thereby degrading drive current. In addition, the halo regions increase junction capacitance, which degrades switching speed performance.

Another approach to preventing performance degradation includes placing a higher doped region in the channel region between the source and drain region that extends from the surface down into the bulk semiconductor material. This higher doped region is of the same conductivity type as the channel region. Although this approach is effective in reducing punch-through, it also decreases carrier mobility in the channel region, which degrades drive current. In an alternative but similar approach, the higher doped region is placed in the channel region below the surface and contacting both the source region and the drain region. This alternative approach improves drive current capability but suffers from reduced breakdown voltage performance and a higher junction capacitance, which in turn degrades switching performance.

As is readily apparent, structures and methods are needed that overcome at least the above problems found in the prior art. It would be advantageous to manufacture such structures in a cost effective and reproducible manner. Additionally, it would be of further advantage for such structures to operate bi-directionally.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Figure 1:
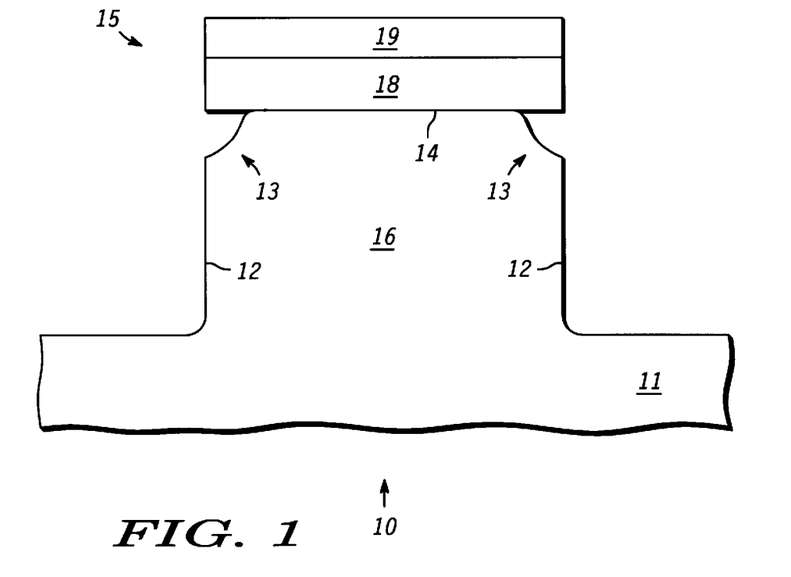
FIGS. 1–4 are enlarged cross-sectional views of a semiconductor device at various stages in a manufacturing process in accordance with the present invention.

FIG. 1 is an enlarged cross-sectional view of a semiconductor device 10 at an early stage of a manufacturing process in accordance with the present invention. As shown in the example that follows, semiconductor device 10 is in an n-channel configuration. However, one skilled in the art will appreciate that a p-channel device can be formed by changing n-type regions to p-type regions and vice versa.

Semiconductor device 10 is formed over a semiconductor substrate 11. To begin, a pedestal structure 16 is formed by removing a potion of semiconductor substrate 11. For example, a masking layer 15 is used to pattern the location of pedestal structure 16. Masking layer 15 can be made from a layer of silicon nitride 19 over a layer of thermal oxide 18, hereinafter referred to as thermal oxide layer 18. These layers can be formed using a conventional Low Pressure Chemical Vapor Deposition (LPCVD) Process, a Plasma Enhanced Chemical Vapor Deposition (PECVD) Process, a thermal oxidation process, or similar technique. Masking layer 15 is patterned using a photolithographic pattern and etch process to pattern silicon nitride layer 19 and thermal oxide layer 18 such as is shown in FIG. 1. A Reactive Ion Etch (RIE) process is then used to partially remove the exposed portions of semiconductor substrate 11 to provide pedestal structure 16.

As shown in FIG. 1, pedestal structure 16 has an upper surface 14, sides 12, and corners 13. The etch process used to form pedestal structure 16 includes an isotropic etch that removes a portion of the corners 13 of pedestal structure 16. In other words, an etch process is used to slightly undercut masking layer 15. This gives the corners 13 of pedestal structure 16 a slightly tapered profile that curves inward from the sides 12 of pedestal structure 16 to the upper surface 14 of pedestal structure 16.

Figure 2:
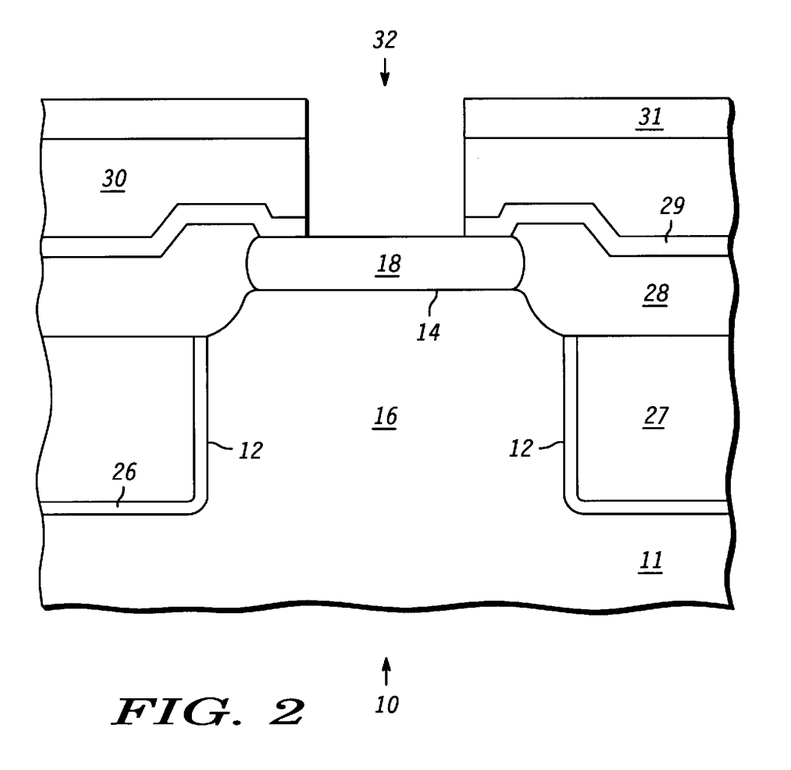

Referring now to FIG. 2, a thermal oxidation process can be optionally performed to form a thermal oxide layer 26 along the surface of semiconductor substrate 11 and the sides 12 of pedestal structure 16. Preferably, thermal oxide layer 26 is about 100 angstroms (Å) to 500 Å thick, and it should be understood that thermal oxide layer 26 may also be formed over the corners 13 of pedestal structure 16. A planarization layer 27 is then formed to provide semiconductor substrate 11 with a relatively planar surface for subsequent processing. For example, planarization layer 27 can be a 3,000 A to 7,000 Å layer of densified tetraethylorthosilicate (TEOS) that is deposited with a PECVD process and then planarized with a chemical-mechanical polish (CMP) process.

An etch process is then used to remove a portion of layer of silicon nitride 19 (see FIG. 1) and thermal oxide layer 18 so that the corners 13 of pedestal structure 16 are exposed. A conductive layer 28 is then formed such that it contacts the corners 13 of the pedestal structure 16. Conductive layer 28 is used to provide electrical connection to current carrying electrodes which are subsequently formed in pedestal structure 16. As shown in FIG. 2, the presence of thermal oxide layer 18 does not allow conductive layer 28 to contact the upper surface 14 of pedestal structure 16. It should be understood that more of thermal oxide layer 18 can be removed so that conductive layer 28 contacts some of the upper surface 14 of pedestal structure 16. Conductive layer 28 is preferably about 1,000 Å to 3,000 Å thick and can be formed with an LPCVD deposition of either polysilicon or amorphous silicon. Following the deposition of conductive layer 28, a CMP process can be used to remove the portion of conductive layer 28 that was over thermal oxide layer 18 (not shown). In such a process, silicon nitride layer 19 (see FIG. 1) is used as an etch stop.

A sequence of dielectric layers are then formed to provide an opening 32 for the subsequent formation of a gate structure. For example, a silicon nitride layer 29 that is about 200 Å to 500 Å thick is deposited on conductive layer 28 using an LPCVD process. Then a TEOS layer 30 that is about 2,000 Å to 5,000 Å thick is deposited on silicon nitride layer 29. Finally, a silicon nitride layer 31 that is about 500 Å to 1,500 Å thick is formed on TEOS layer 30 using an LPCVD process. It should be noted that a CMP process may be used during any point in the formation of the above mentioned dielectric layers to provide a planar surface across semiconductor substrate 11. Preferably, this would occur immediately after the formation of TEOS layer 30. Photolithographic mask and etch processes are then used to form opening 32 and expose a portion of thermal oxide layer 18 to complete the processing shown in FIG. 2.

Figure 3:
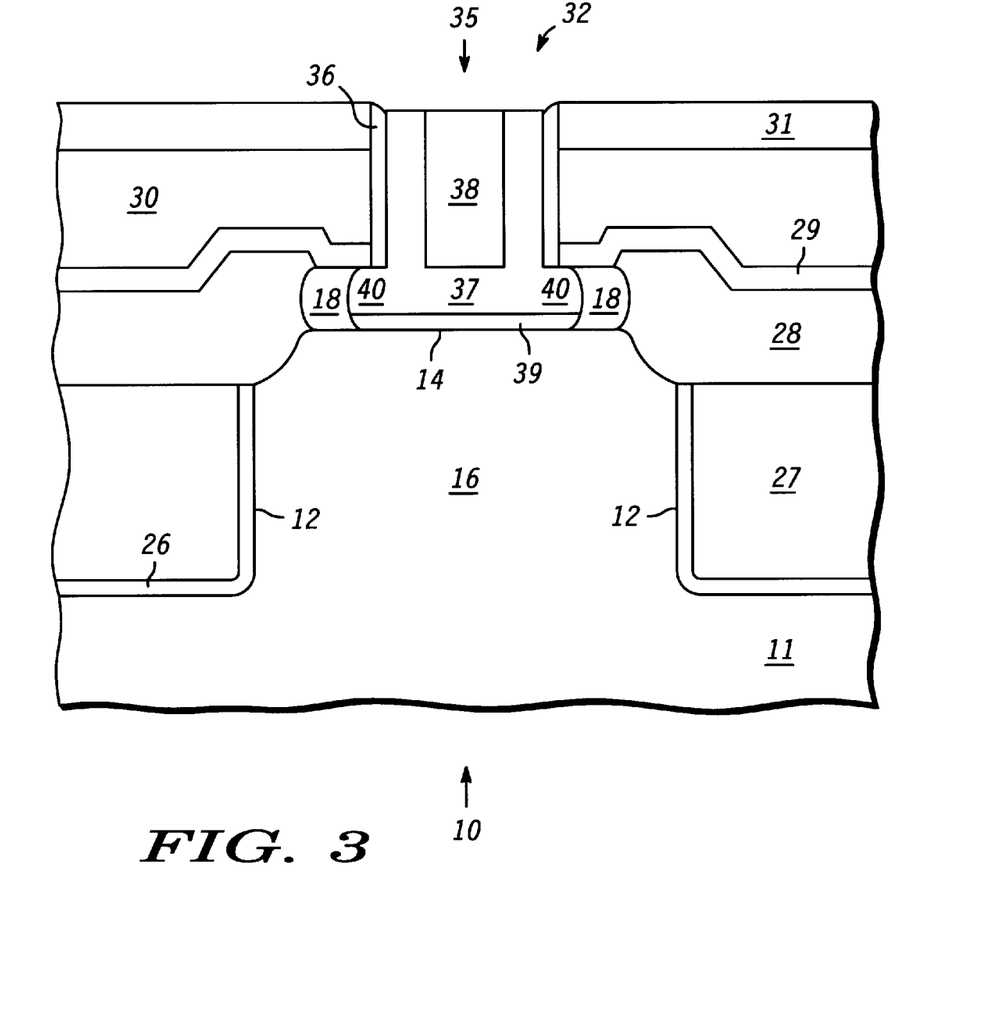

FIG. 3 is an enlarged cross-sectional view of semiconductor device 10 and is used to illustrate an example of forming a gate structure 35 on pedestal structure 16. To begin, a silicon nitride layer (not shown) is formed over silicon nitride layer 31 and along the sides of opening 32 and thermal oxide layer 32. Preferably, the silicon nitride layer is about 150 Å to 350 Å thick and is formed using an LPCVD process. An anisotropic etch is then used to remove the portion of the silicon nitride layer over thermal oxide layer 18 and over silicon nitride layer 31 to form silicon nitride sidewall spacers 36. An isotropic etch is then used to remove the exposed portions of thermal oxide layer 18. It should be noted that the presence of silicon nitride sidewall spacers 36 along the sides of opening 32 prevents TEOS layer 30 from being etched. As shown in FIG. 3, the isotropic etch undercuts thermal oxide layer 18 to provide a foot region 40 that extends laterally from the sides of opening 32 adjacent to the upper surface 14 of the pedestal structure 16. A portion of thermal oxide layer 18 remains, and as shown in FIG. 3, has a thickness that is substantially equal to a thickness of the foot region 40 of gate structure 35.

Once the portion of thermal oxide layer 18 exposed by opening 32 has been removed, a variety of implantation processes can performed to form doped regions (not shown) in pedestal structure 16 to adjust the operational performance of semiconductor device 10. One such process was taught in a co-pending application by Davies et al., which has Ser. No. 08/608,864 and which is hereby incorporated by reference.

The formation of gate structure 35 continues with the formation of a gate oxide layer 39 that is preferably about 20 Å to 150 Å thick. An undoped layer of amorphous silicon 37, hereinafter referred to as amorphous silicon layer 37, is formed to line the sides of opening 32 and to fill the foot region 40 of gate structure 35. Preferably, amorphous silicon layer 37 is about 200 Å to 1000 Å thick and is formed with an LPCVD process. A doped layer of amorphous silicon 38, hereinafter referred to as amorphous silicon layer 38, is then formed with an LPCVD process to provide a doped core for gate structure 35. The doping concentration of amorphous silicon layer 38 can be adjusted to vary the operational performance of semiconductor device 10. It should be understood that in the process described above, gate structure 35 can be formed with polysilicon or similar material instead of amorphous silicon, and if desired, can be formed from a single layer of material. A dry etch or CMP process is used to recess gate structure 35 as shown in FIG. 3.

Figure 4:
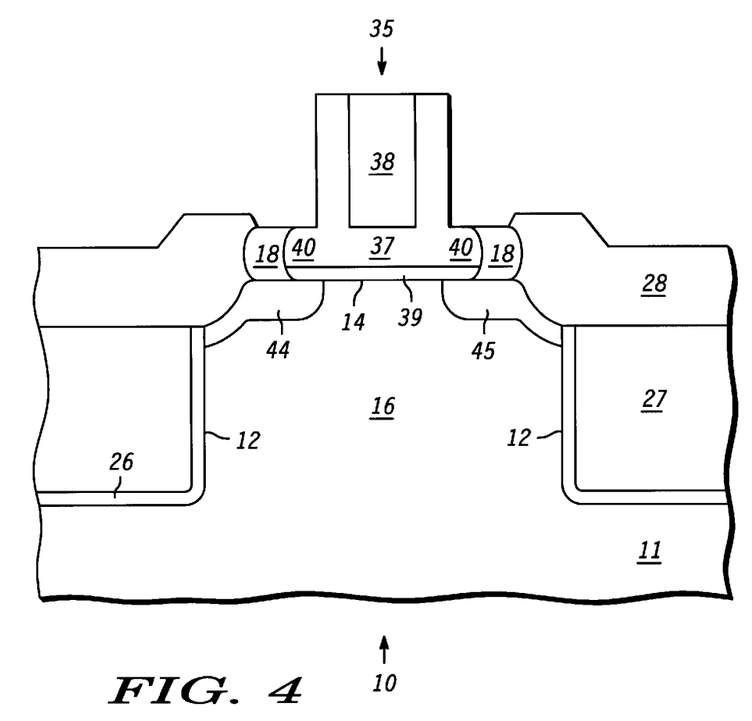

FIG. 4 is an enlarged cross-section view of semiconductor device 10 and is provided to illustrate the formation of a source region 44 and a drain region 45 in pedestal structure 16. To begin, silicon nitride layer 31 is removed using a wet etch solution. It should be noted that a portion of silicon nitride sidewall spacers 36 would remain along the sides of gate structure 35. A wet etch solution is then used to remove TEOS layer 30.

An ion implantation process is then used to form source region 44 and drain region 45. For example, an n-type dopant such as phosphorus is implanted vertically into pedestal structure 16 at an energy ranging from about 50 keV to 150 keV and a dose ranging from about $1 \times 10^{15}$ atoms/centimeter$^2$ (cm$^2$) to $5 \times 10^{15}$ atoms/cm$^2$. Preferably, the dopant is implanted perpendicularly to the upper surface 14 of pedestal structure 16, but an implant angle ranging from about 0° to 7° may also be desirable. It may also be desirable to form a pre-implant screen oxide (not shown) along the exposed top surface of gate structure 35 and conductive layer 28.

Following the implantation of the dopant, the remaining portions of silicon nitride sidewall spacers 36 are removed and an anneal step is performed to activate the implanted dopant. An anneal in an inert ambient at about 950° C. to 1150° C. for about 30 seconds to 45 minutes can be used to activate the dopant. The anneal process can give source region 44 and drain region 45 a shape such as is shown in FIG. 4. For example, source region 44 and drain region 45 extend laterally such that they contact the entire tapered profile of the corners 13 of pedestal structure 16. If a shorter or lower temperature anneal is used, then only a portion of source region 44 and drain region 45 will be juxtaposed to the tapered profile of the corner 13 of pedestal structure 16.

After the formation of source region 44 and drain region 45, the processing of semiconductor device 10 may continue to include the formation of sidewall spacers and a silicidation process to enhance the electrical characteristics of conductive layer 28.

One advantage of the process described above is that source region 44 and drain region 45 are self-aligned to the sides or edges of gate structure 35. Therefore, any misalignment that may occur in the formation of opening 32 (see FIG. 2) can be tolerated since source region 44 and drain region 45 move accordingly. Another advantage of the present invention is that the tapered profile of corners 13 of pedestal structure 16 help reduce the high electric field where gate structure 35 passes over the side 12 of pedestal structure 16. This improves the operational control of semiconductor device 10 and reduces parasitic leakage currents.

Figure 5:
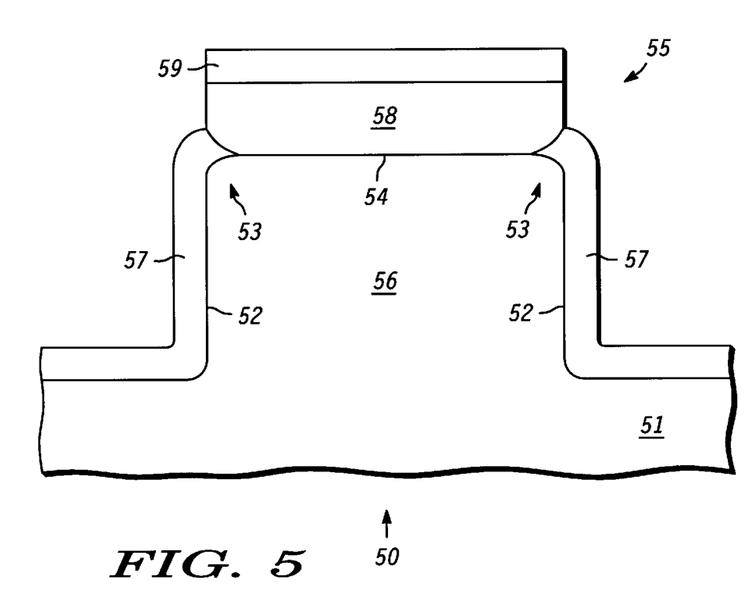
FIGS. 5–9 are enlarged cross-sectional views of a semiconductor device at various stages in a manufacturing process in accordance with an alternate embodiment of the present invention.

FIG. 5 is an enlarged cross-sectional view of a semiconductor device 50 at an early stage of a manufacturing process in accordance with an alternate embodiment of the present invention. Semiconductor device 50 is formed over a semiconductor substrate 51. To begin, a pedestal structure 56 is formed by removing a potion of semiconductor substrate 51. For example, a masking layer 55 is used to pattern the location of pedestal structure 56. Masking layer 55 can be made from a layer of silicon nitride 59 over a layer of thermal oxide 58, hereinafter referred to as thermal oxide layer 58. Masking layer 55 is patterned using a photolithographic pattern and etch process to pattern silicon nitride layer 59 and thermal oxide layer 58 such as is shown in FIG. 5. An RIE process is then used to partially remove the exposed portions of semiconductor substrate 51 to provide pedestal structure 56.

As shown in FIG. 5, pedestal structure 56 has an upper surface 54, sides 52, and corners 53. After pedestal structure 56 is formed, a thermal oxidation process is performed to form silicon dioxide layer 57. Preferably, silicon dioxide layer 57 is about 300 Å to 1250 Å thick and extends partially under thermal oxide layer 58 along the upper surface 54 of pedestal structure 56. The formation of silicon dioxide layer 57 rounds the corners 53 of pedestal structure 56.

Figure 6:
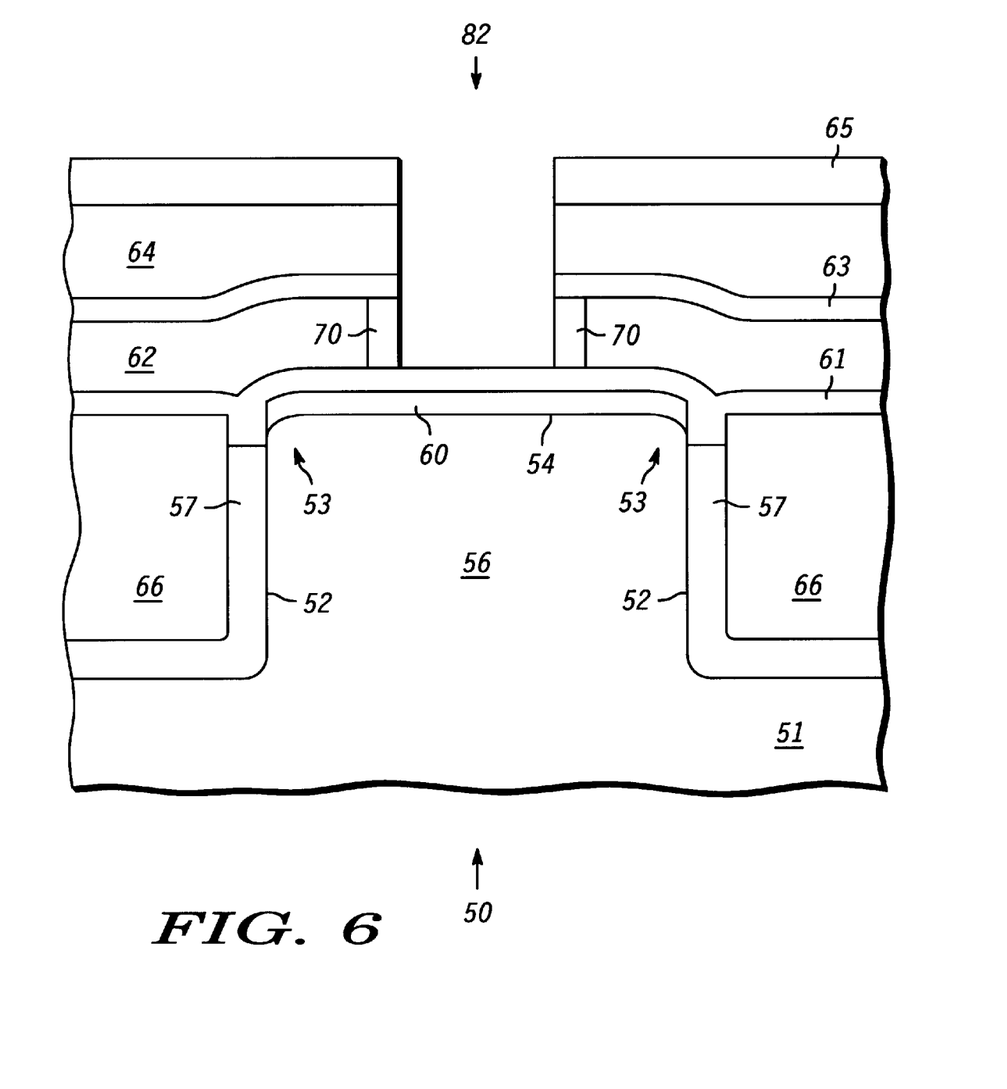

Referring now to FIG. 6, a planarization layer 66 is then formed to provide semiconductor substrate 51 with a relatively planar surface for subsequent processing. For example, planarization layer 66 can be a 3,000 Å to 7,000 Å layer of densified TEOS that is deposited with either an LPCVD or a PECVD process and then planarized with a CMP process. Appropriate wet etch processes are then used to remove the remaining portions of silicon nitride layer 59 and thermal oxide layer 58 (see FIG. 5) to expose the upper surface 54 of pedestal structure 56.

A thermal oxidation process is then used to form silicon dioxide layer 60 which is preferably about 50 Å to 150 Å thick. A silicon nitride layer 61 is then formed over silicon dioxide layer 60 and planarization layer 66 using an LPCVD process. Silicon nitride layer 61 can be about 200 Å to 500 Å thick. A conductive layer 62 is then formed on silicon nitride layer 61 using for example an LPCVD process that deposits a layer of polysilicon or amorphous silicon. Conductive layer 62 is preferably about 800 Å to 3,000 Å thick.

A sequence of dielectric layers are then formed prior to the formation of an opening 82 for the subsequent formation of a gate structure. For example, a silicon nitride layer 63 that is about 200 Å to 500 Å thick is deposited on conductive layer 62 using an LPCVD process. Then a TEOS layer 64 that is about 2,000 Å to 5,000 Å thick is deposited on silicon nitride layer 63. Finally, a silicon nitride layer 65 that is about 500 Å to 1,500 Å thick is formed on TEOS layer 64 using an LPCVD process. It should be noted that a CMP process may be used during any point in the formation of the above mentioned dielectric layers to provide a planar surface across semiconductor substrate 51. Preferably, this would be performed immediately after the formation of TEOS layer 64. Photolithographic mask and etch processes are then used to form opening 82 and expose a portion of silicon nitride layer 61 and a portion of conductive layer 62 along the sides of opening 82. A thermal oxidation process is then used to form silicon dioxide spacers 70 which serve to protect conductive layer 62 from subsequent processing and to electrically isolate conductive layer 62 from the gate structure to be formed in opening 82.

Figure 7:
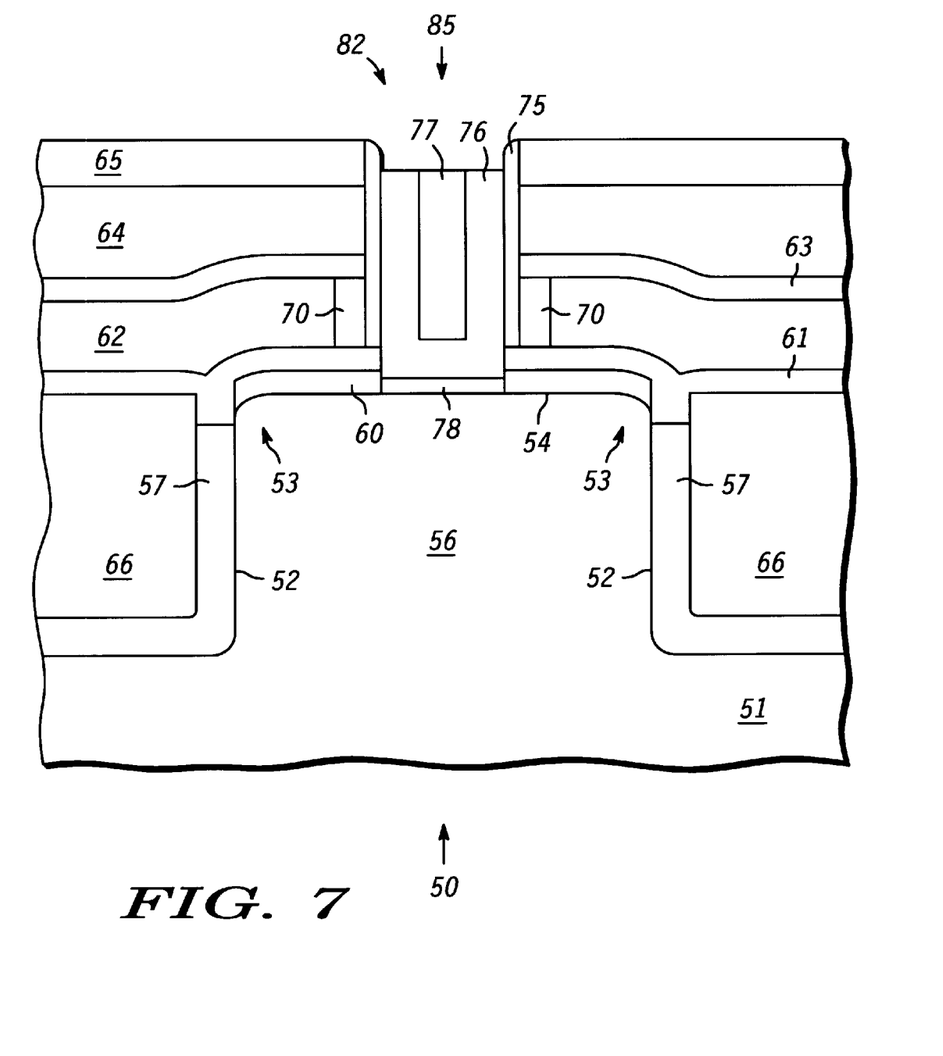

Referring now to FIG. 7, an example for forming a gate structure 85 is provided. A silicon nitride layer (not shown) is formed on silicon nitride layer 65, along the sides of opening 82, and on the remaining portions of silicon nitride layer 61. The silicon nitride layer can be formed using an LPCVD process and is preferably about 100 Å to 400 Å thick. An RIE etch is then used to remove a portion of the silicon nitride layer and silicon nitride layer 61 over silicon dioxide layer 60 to form silicon nitride sidewall spacers 75. At this point, a sequence of implantation process can be optionally performed as suggested in the previous embodiment.

Continuing with the formation of semiconductor device 50, the exposed portion of silicon dioxide layer 60 is removed and a thermal oxidation process is used to form gate oxide layer 78. Preferably, gate oxide layer 78 has a thickness ranging from about 20 Å to 150 Å. The rest of gate structure 85 is formed from a single or a sequence of layers. For example, an undoped layer of amorphous silicon 76, hereinafter referred to as amorphous silicon layer 76, is formed to line the sides of opening 82. Preferably, amorphous silicon layer 76 is about 200 Å to 1000 Å thick and is formed with an LPCVD process. A doped layer of amorphous silicon 77, hereinafter referred to as amorphous silicon layer 77, is then formed with an LPCVD process to provide a doped core for gate structure 85. It should be understood that in the process described above, gate structure 85 can be formed with polysilicon or similar material instead of amorphous silicon. A dry etch or CMP process is then used to remove amorphous silicon layer 76 and doped amorphous silicon layer 77 that is over silicon nitride layer 65 and to recess gate structure 85 as shown in FIG. 7.

Figure 8:
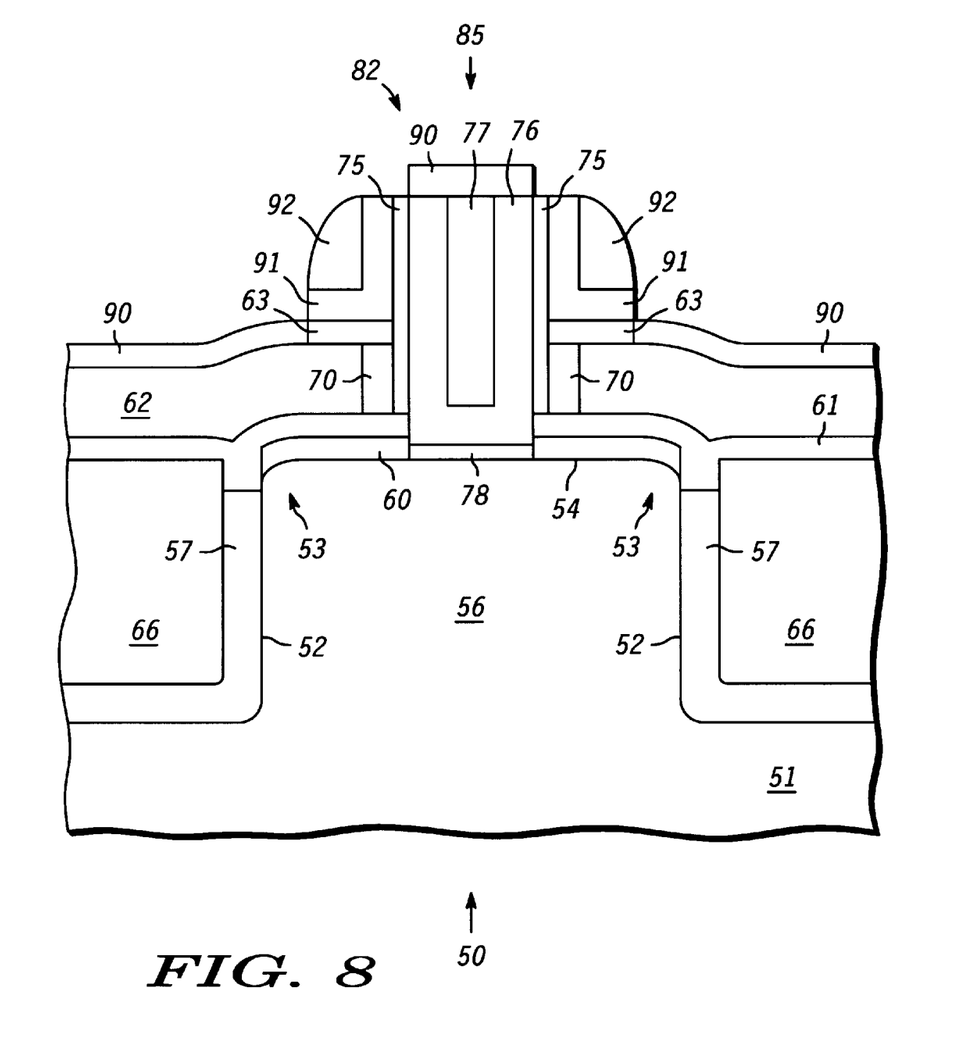

Referring now to FIG. 8, the formation of semiconductor device 50 continues by removing the exposed portions of silicon nitride layer 65 and TEOS layer 64 using the appropriate wet etch solutions. A polysilicon layer 91 is then formed on silicon nitride layer 63 and across the top surface of gate structure 85 using an LPCVD deposition. Polysilicon layer 91 can be about 50 Å to 250 Å thick. A silicon nitride layer (not shown) that is about 500 Å to 2,500 Å thick is formed on polysilicon layer 91 and patterned with an RIE to form sidewall spacers 92. Using sidewall spacers 92 as a hard mask, the exposed portions of polysilicon layer 91 and silicon nitride layer 63 are removed with the appropriate etch process. A portion of polysilicon layer 91 will remain both under sidewall spacers 92 and between sidewall spacers 92 and silicon nitride sidewall spacers 75.

A thermal oxidation process is performed to oxidize the exposed portions of conductive layer 62 and the top surface of gate structure 85. Consequently, a silicon dioxide layer 90 that is about 150 Å to 500 Å thick is formed, which is subsequently used as a hard mask for the formation of current carrying electrodes in pedestal structure 56.

Figure 9:
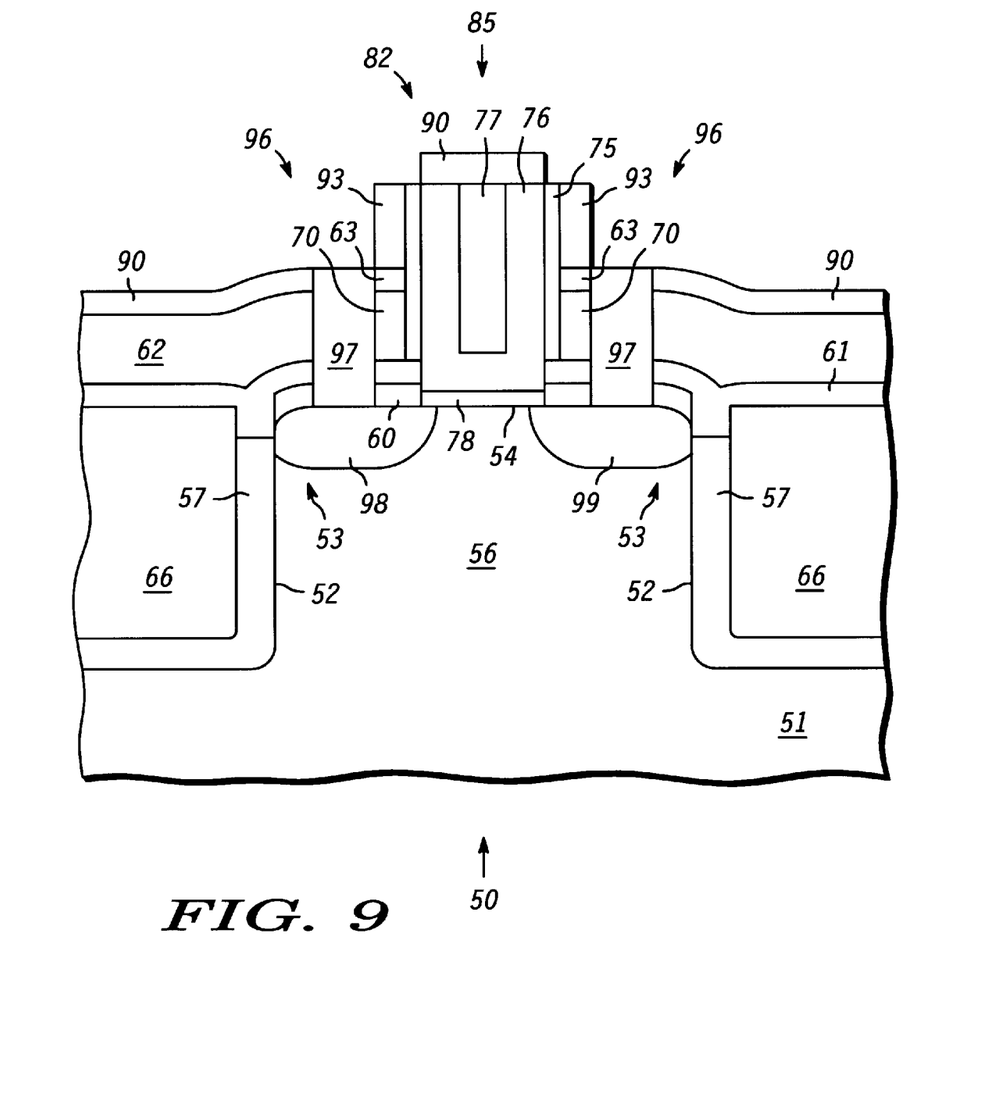

Turning now to FIG. 9, a wet etch process is used to remove sidewall spacers 92 (see FIG. 8) and an anisotropic etch is used to remove the portion of polysilicon layer 91 over silicon nitride layer 63. An oxidation process is then used to convert the remaining portions of polysilicon layer 91 along the sides of gate structure 85 into silicon dioxide spacers 93. A wet etch solution such as phosphoric acid is then used to remove the exposed portions of silicon nitride layer 63 to expose the underlying portions of conductive layer 62. An anisotropic etch is then used to removed the exposed portions of conductive layer 62, silicon nitride layer 61, and silicon dioxide layer 60 to expose portions of the upper surface 54 of pedestal structure 56 through openings % adjacent to gate structure 85.

A layer of undoped amorphous silicon or polysilicon 97, hereinafter referred to as polysilicon layer 97, is deposited and partially removed using an isotropic etch so that the remaining portions of polysilicon layer 97 contact the upper surface 54 of pedestal structure 56 and fill openings 96.

An ion implantation process is then used to form source region 98 and drain region 99. For example, an-type dopant such as phosphorus is implanted into pedestal structure 56 at an energy ranging from about 50 keV to 150 keV and a dose ranging from about $1\times10^{15}$ atoms/centimeter$^2$ (cm$^2$) to $5\times10^{15}$ atoms/cm$^2$. Preferably, the dopant is implanted at an angle ranging from about 30° to 60° relative to the upper surface 54 of pedestal structure 56. Thermal oxide layers 90 and 93 act as a pre-implant screen oxide along the exposed top surface of polysilicon layer 97. The purpose of the implantation process is to dope the remaining portions of polysilicon layer 97 and conductive layer 62. A high temperature anneal step is then used to drive the implanted dopant from the remaining portions of polysilicon layer 97 into pedestal structure 56, thereby forming source region 98 and drain region 99. An anneal at about 950° C. to 1150° C. for about 30 seconds to 45 minutes is sufficient for this step.

One advantage of this alternate embodiment is that the formation of source region 98 and drain region 99 is self-aligned to gate structure 85 through the formation of sidewall spacers 92 (see FIG. 8). This makes semiconductor devices formed in accordance with the present invention more tolerant to mis-alignment during the photolithographic process steps. Another feature of this alternate embodiment is that conductive layer 62 does not contact the corners 53 or the sides 52 of the pedestal structure 56 and is electrically isolated from the upper surface 54 of pedestal structure 56 by silicon nitride layer 61. This alternative embodiment also reduces the operational leakage current by rounding the corners 53 of pedestal structure 56 where gate structure 85 passes over the sides 52 of pedestal structure 56. In addition, both embodiments improve the performance of the semiconductor device by obviating the need to expose the upper surface of the pedestal structure where the gate structure is formed to potentially harmful RIE processing.

By now it should be appreciated that the present invention provides several structures, and methods for making the same, that can be formed to improve performance characteristics of a semiconductor device.

We claim:

1. A semiconductor device comprising:
   a semiconductor substrate;
   a pedestal structure overlying the semiconductor substrate, wherein the pedestal structure has an upper surface, sides, a corner, the corner having a tapered profile that curves inward from the sides of the pedestal structure to the upper surface of the pedestal structure;
   a gate structure overlying the upper surface of the pedestal structure, wherein the gate structure has sides;
   a source region and a drain region in the pedestal structure, wherein the source region extends laterally so that the source region contacts the entire tapered profile of the corner of the pedestal structure; and
   a conductive layer that contacts the corner of the pedestal structure and is electrically coupled to the source region.
   a second conductive material that contacts both the upper surface of the pedestal structure overlying the source region and contacts the first conductive material.

2. The semiconductor device of claim 1 wherein the conductive layer does not contact the upper surface of the pedestal structure.

3. The semiconductor device of claim 1 wherein the gate structure includes a foot region that extends laterally from the sides of the gate structure adjacent to the upper surface of the pedestal structure.

4. The semiconductor device of claim 3 further comprising a dielectric material adjacent to the sides of the gate structure, wherein the dielectric material has a thickness that is substantially equal to a thickness of the foot region of the gate structure.

5. The semiconductor device of claim 1 wherein the gate structure includes:
   a first layer of undoped material; and
   a core comprising doped material, wherein the core is encompassed by the first layer of undoped material.

6. A semiconductor device comprising:
   a semiconductor substrate;
   a pedestal structure overlying the semiconductor substrate, wherein the pedestal structure has an upper surface, sides, and corners, the corners having a tapered profile that curves inward from the sides of the pedestal structure to the upper surface of the pedestal structure;
   a gate structure overlying the upper surface of the pedestal structure, wherein the gate structure has sides and a foot region that extends laterally from the sides of the gate structure; and
   a conductive layer that contacts one of the corners of the pedestal structure.

7. The semiconductor device of claim 6 wherein the conductive layer does not contact the upper surface of the pedestal structure.

8. The semiconductor device of claim 6 further comprising a current carrying electrode in the pedestal structure that is juxtaposed to the tapered profile of one of the corners of the pedestal structure.

9. The semiconductor device of claim 8 wherein the conductive layer contacts the current carrying electrode at one of the corners of the pedestal structure.

10. The semiconductor device of claim 6 further comprising a dielectric material adjacent to the sides of the gate structure, wherein the dielectric material has a thickness that is substantially equal to a thickness of the foot region of the gate structure.

11. A semiconductor device comprising:
    a semiconductor substrate;
    a pedestal structure having an upper surface, a side, and a corner between the upper surface and the side, wherein the corner of the pedestal structure is rounded;
    a gate structure overlying the upper surface of the pedestal structure;
    a source region in the pedestal structure;
    a first dielectric layer overlying the upper surface of the pedestal structure and the source region;
    a first conductive material overlying at least a portion of the upper surface of the pedestal structure and the first dielectric layer, wherein the first conductive material is electrically isolated from the upper surface of the pedestal structure by the first dielectric layer; and
    a second conductive material that contacts both the upper surface of the pedestal structure overlying the source region and contacts the first conductive material.

12. The semiconductor device of claim 11 wherein the first conductive material does not contact the corner or the side of the pedestal structure.

13. The semiconductor device of claim 11 wherein the first dielectric layer has an opening, and the second conductive material passes through the opening in the first dielectric layer to contact the upper surface of the pedestal structure.

14. The semiconductor device of claim 11 further comprising a second dielectric layer and a third dielectric layer between the side of the gate structure and the second conductive material.

15. The semiconductor device of claim 14 wherein the second dielectric layer comprises silicon dioxide and the third dielectric layer comprises silicon nitride.

16. A semiconductor device comprising:

a silicon semiconductor substrate;

a pedestal structure overlying the silicon semiconductor substrate, wherein the pedestal structure has an upper surface, sides, and a corner, and wherein the sides of the pedestal have a first portion that is substantially orthogonal to the silicon semiconductor substrate, and the corner has a tapered profile that curves inward from the first portion of the sides of the pedestal structure to the upper surface of the pedestal structure;

a first doped region in the pedestal structure; and a conductive layer that contacts the corner of the pedestal structure and is electrically coupled to the first doped region.

17. The semiconductor device of claim 16 wherein the conductive layer does not contact the upper surface of the pedestal structure.

18. The semiconductor device of claim 16 further comprising a gate structure overlying the upper surface of the pedestal structure that includes a foot region that extends laterally from sides of the gate structure adjacent to the upper surface of the pedestal structure.

19. The semiconductor device of claim 18 further comprising a dielectric material adjacent to the sides of the gate structure, wherein the dielectric material has a thickness that is substantially equal to a thickness of the foot region of the gate structure.

20. The semiconductor device of claim 18 wherein the gate structure includes:

a first layer of undoped material; and a core comprising doped material, wherein the core is encompassed by the first layer of undoped material.

21. The semiconductor device of claim 16 wherein the first doped region extends laterally such that the first doped region contacts the entire tapered profile of the corner of the pedestal structure.

* * * * *

UNITED STATES PATENT AND TRADEMARK OFFICE
CERTIFICATE OF CORRECTION

PATENT NO. : 5,920,095
DATED : July 6, 1999
INVENTOR(S) : Robert B. Davies et al.

It is certified that error appears in the above-identified patent and that said Letters Patent is hereby corrected as shown below:

Column 7,
Lines 57, 58 and 59, delete all lines.

Signed and Sealed this

Fourteenth Day of May, 2002

Attest:

JAMES E. ROGAN
Attesting Officer    Director of the United States Patent and Trademark Office